(12) United States Patent
Shim et al.

(10) Patent No.: US 10,384,286 B2
(45) Date of Patent: Aug. 20, 2019

(54) METHOD FOR BONDING FLEXIBLE PART INCLUDING INCLINED LEADS

(71) Applicant: PROTEC CO., LTD., Gyeonggi-do (KR)

(72) Inventors: Moo Sup Shim, Seoul (KR); Seong Yong Ji, Seoul (KR); Hyoung Yeon Ju, Daejeon (KR); Chiho Cho, Incheon (KR)

(73) Assignee: PROTEC CO., LTD., Gyeonggi-do (KR)

( * ) Notice: Subject to any disclaimer, the term of this patent is extended or adjusted under 35 U.S.C. 154(b) by 59 days.

(21) Appl. No.: 15/896,025

(22) Filed: Feb. 13, 2018

(65) Prior Publication Data

US 2019/0001426 A1   Jan. 3, 2019

(30) Foreign Application Priority Data

Jun. 30, 2017 (KR) .................. 10-2017-0083436

(51) Int. Cl.
*B23K 3/06* (2006.01)
*B23K 3/08* (2006.01)
*B23K 1/00* (2006.01)
*H01L 23/00* (2006.01)
*H05K 3/34* (2006.01)
*B23K 101/36* (2006.01)

(52) U.S. Cl.
CPC .......... *B23K 3/0623* (2013.01); *B23K 1/0016* (2013.01); *B23K 3/087* (2013.01); *H01L 24/741* (2013.01); *H05K 3/3426* (2013.01); *B23K 2101/36* (2018.08); *H05K 2201/10757* (2013.01); *H05K 2203/041* (2013.01)

(58) Field of Classification Search
CPC .................................................. B23K 3/0623
See application file for complete search history.

(56) References Cited

U.S. PATENT DOCUMENTS

2016/0250704 A1* 9/2016 Azdasht ............... B23K 1/0056
                                                         219/121.65
2018/0211932 A1* 7/2018 Woo ........................ H01L 24/75

* cited by examiner

*Primary Examiner* — Daniel H Lee
(74) *Attorney, Agent, or Firm* — JCIPRNET (57) ABSTRACT

A method of bonding a flexible part including inclined leads is provided, and more particularly, a method of bonding a flexible part including inclined leads, in which parts are aligned to bond the parts is provided. According to the method of bonding the flexible part including inclined leads, an electronic part may be easily bonded to a part having an inclined surface.

9 Claims, 12 Drawing Sheets

METHOD FOR BONDING FLEXIBLE PART INCLUDING INCLINED LEADS

CROSS-REFERENCE TO RELATED APPLICATION

This application claims the benefit of Korean Patent Application No. 10-2017-0083436, filed on Jun. 30, 2017, in the Korean Intellectual Property Office, the disclosure of which is incorporated herein in its entirety by reference.

BACKGROUND

1. Field

One or more embodiments relate to a method of bonding a flexible part including inclined leads, and more particularly, to a method for bonding a flexible part including inclined leads used to align parts to bond the parts.

2. Description of the Related Art

Various methods are used to bond an electronic part such as a semiconductor chip to parts such as a board. A flip-chip type semiconductor chip may be temporarily bonded to a board by using flux, and then the electronic part may be bonded via a reflow process, or the electronic part may be bonded through wire bonding.

The bonding methods according to the related art as described above are typically based on the assumption that an electronic part or a lead of the electronic part that is to be bonded to a board (part) and the board are placed to horizontally face each other.

Recently, as the usage of electronic parts has diversified, sometimes a substrate and an electronic part are tilted with respect to each other. In addition, sometimes the need has arisen to bond a lead that electrically connects an electronic part to a substrate to, an inclination surface that is inclined with respect to a plane where the substrate is placed.

Thus, a novel method of aligning parts to effectively bond a part having an inclined lead to a substrate is required.

SUMMARY

One or more embodiments include a method of bonding a flexible part including inclined leads, whereby an electronic part may be effectively bonded to an inclined bonding surface.

Additional aspects will be set forth in part in the description which follows and, in part, will be apparent from the description, or may be learned by practice of the presented embodiments.

According to one or more embodiments, a method of bonding a flexible part including inclined leads is included, in which at least one inclined lead of a first part that is inclined with respect to a plane where the first part and a second part face each other, is bonded to at least one inclined pad of the second part formed to face the at least one inclined lead, wherein the method includes: (a) clamping the first part by using a first fixing member mounted to a support bracket that is rotatably mounted with respect to a base; (b) clamping the second part by using a second fixing member mounted to the support bracket; (c) transporting the second fixing member by using a second transporting unit that is fixed to the support bracket and transports the second fixing member relative to the support bracket so as to align a location of the second part with respect to the first part clamped by the first fixing member; (d) moving the first part, which is clamped by the first fixing member, near the second part clamped by the second fixing member, by using a first transporting unit that is mounted to the support bracket and transports the first fixing member relative to the support bracket; (e) rotating the support bracket with respect to the base by using a tilt unit rotating the support bracket with respect to the base, such that the at least one inclined lead of the first part and the at least one inclined pad of the second part face a bonding head bonding the at least one inclined lead to the at least one inclined pad; and (f) bonding the at least one inclined lead of the first part to the at least one inclined pad of the second part by using the bonding head.

BRIEF DESCRIPTION OF THE DRAWINGS

These and/or other aspects will become apparent and more readily appreciated from the following description of the embodiments, taken in conjunction with the accompanying drawings.

FIGS. 5A, 6A, 7A through 8 are views for describing an operation of the apparatus used in the method of bonding a flexible part including inclined leads illustrated in FIG. 2.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Hereinafter, a method of bonding a flexible part including inclined leads according to an embodiment of the present disclosure will be described with reference to the attached drawings.

First, parts used in the method of bonding a flexible part including inclined leads according to the present embodiment will be described with reference to FIG. 4.

A first part 10 includes a main body 11, a plurality of inclined leads 12, and a plurality of horizontal leads 13. The first part 10 includes the plurality of inclined leads 12 at a side surface of the main body 11 and the plurality of horizontal leads 13 at the opposite side surface of the main body 11. Referring to FIG. 4, the inclined leads 12 are inclined with respect to the main body 11. The horizontal leads 13 are placed to be parallel to the main body 11. An angle of the inclined leads 12 with respect to the main body 11 is fixed, but an error in the actual angle of the inclined leads 12 may be generated during the manufacturing process of the first part 10.

A second part 20 includes a bonding portion 21, a plurality of inclined pads 22, and a plurality of horizontal pads 23. Referring to FIG. 4, the bonding portion 21 of the second part 20 is planarly formed to face the main body 11 of the first part 10. The inclined pads 22 are inclined with respect to the bonding portion 21. An angle between the inclined pads 22 and the second part 20 is identical to the angle between the inclined leads 12 and the main body 11 of the first part 10 described above. The horizontal pads 23 are formed to be parallel to the bonding portion 21.

Figure 4:
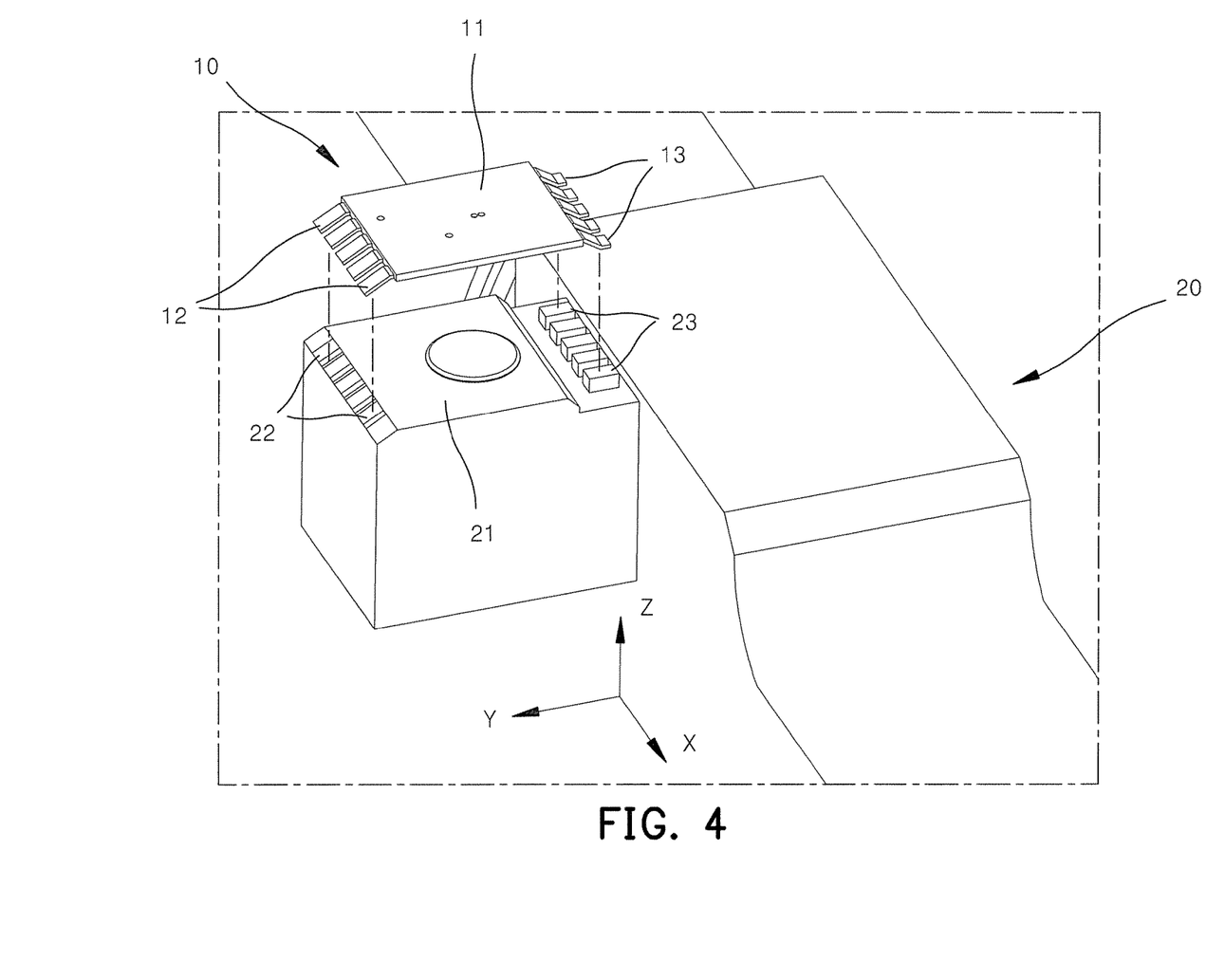
FIG. 4 is a perspective view of a first part and a second part that are bonded using the method of bonding a flexible part including inclined leads illustrated in FIG. 2.
Figure 5A:
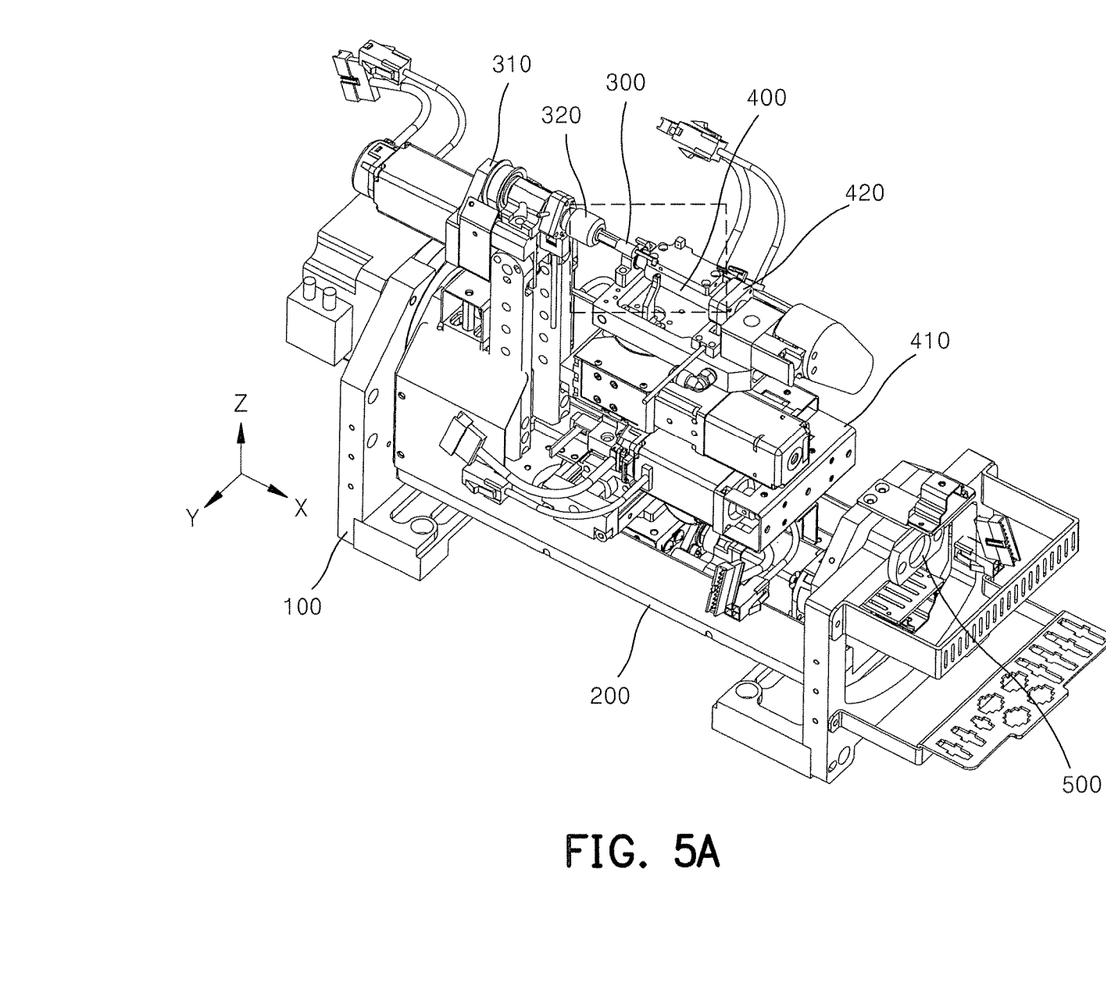
Figure 5B:
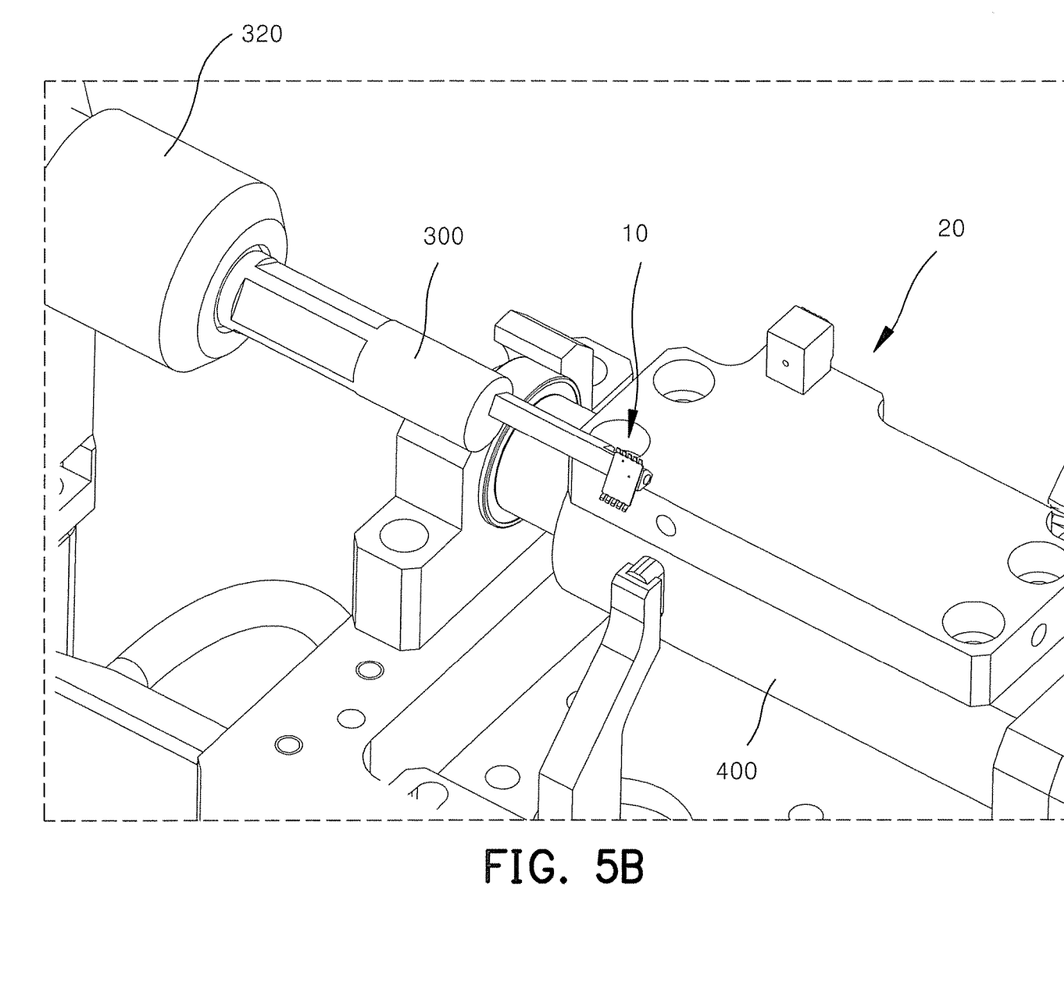
FIGS. 5B, 6B and 7B are partial enlarged perspective views of FIGS. 5A, 6A and 7A, respectively.

Referring to FIG. 4, the plurality of inclined leads 12 of the first part 10 are respectively bonded to the plurality of inclined pads 22 of the second part 20. Due to the above-described structure of the first part 10 and the second part 20, the inclined leads 12 and the inclined pads 22 are respectively inclined with respect to a plane where the main body 11 of the first part 10 and the bonding portion 21 of the second part 20 face each other. The plurality of horizontal leads 13 of the first part 10 are respectively bonded to the plurality of horizontal pads 23 of the second part 20. The horizontal leads 13 and the horizontal pads 23 are formed to be parallel to the plane where the main body 11 of the first part 10 and the bonding portion 21 of the second part 20 face each other.

According to the method of bonding a flexible part including inclined leads according to the present disclosure, an arrangement angle between the first part 10 and the second part 20 may be easily adjusted, and thus, the inclined leads 12 and the inclined pads 22 may be effectively bonded.

Next, a configuration of an apparatus used in the method of bonding a flexible part including inclined leads according to the present embodiment will be described with reference to FIGS. 2, 3A and 3B.

Figure 2:
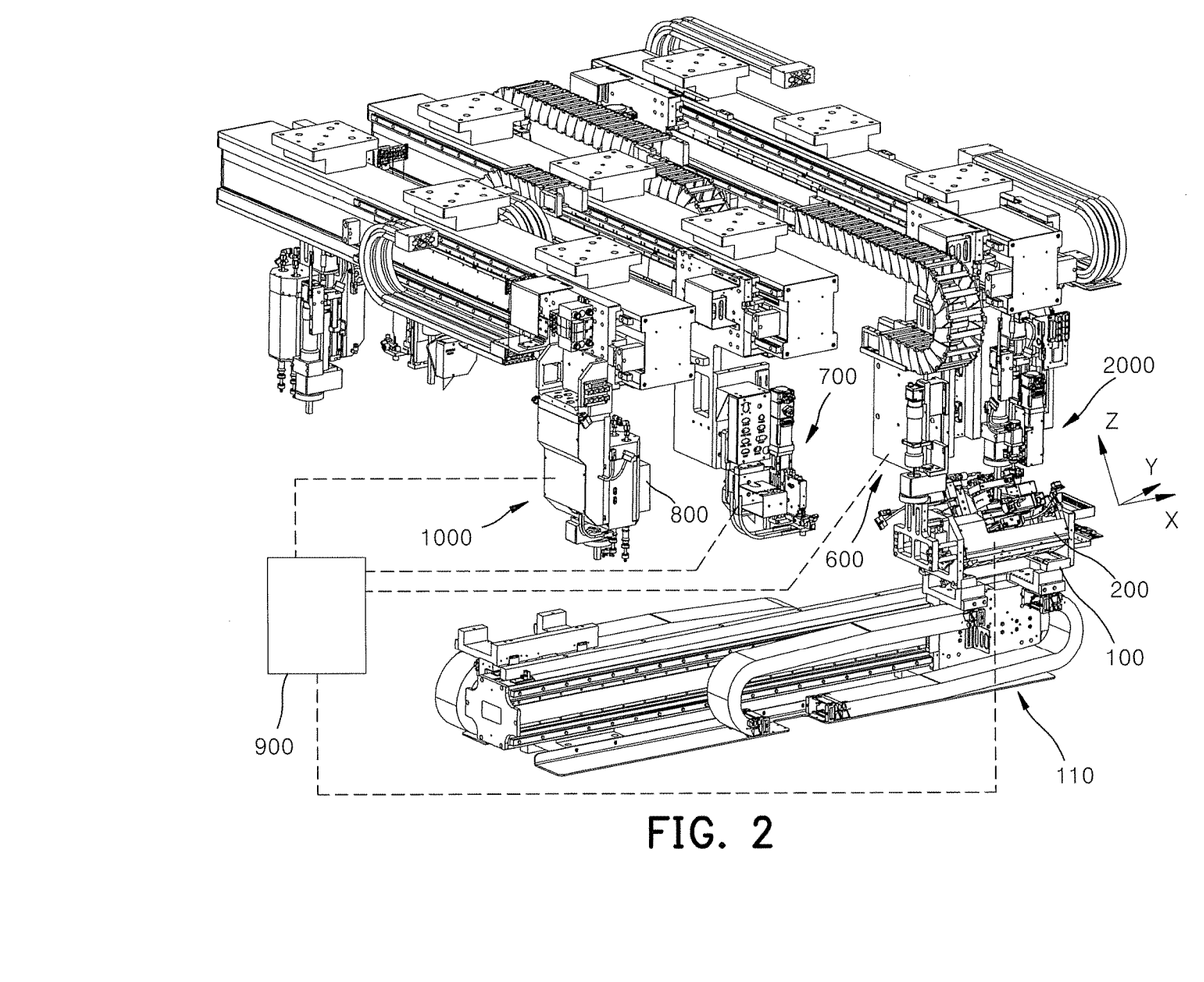
FIG. 2 is a perspective view of an apparatus used in the method of bonding a flexible part including inclined leads, according to an embodiment of the present disclosure.
Figure 3A:
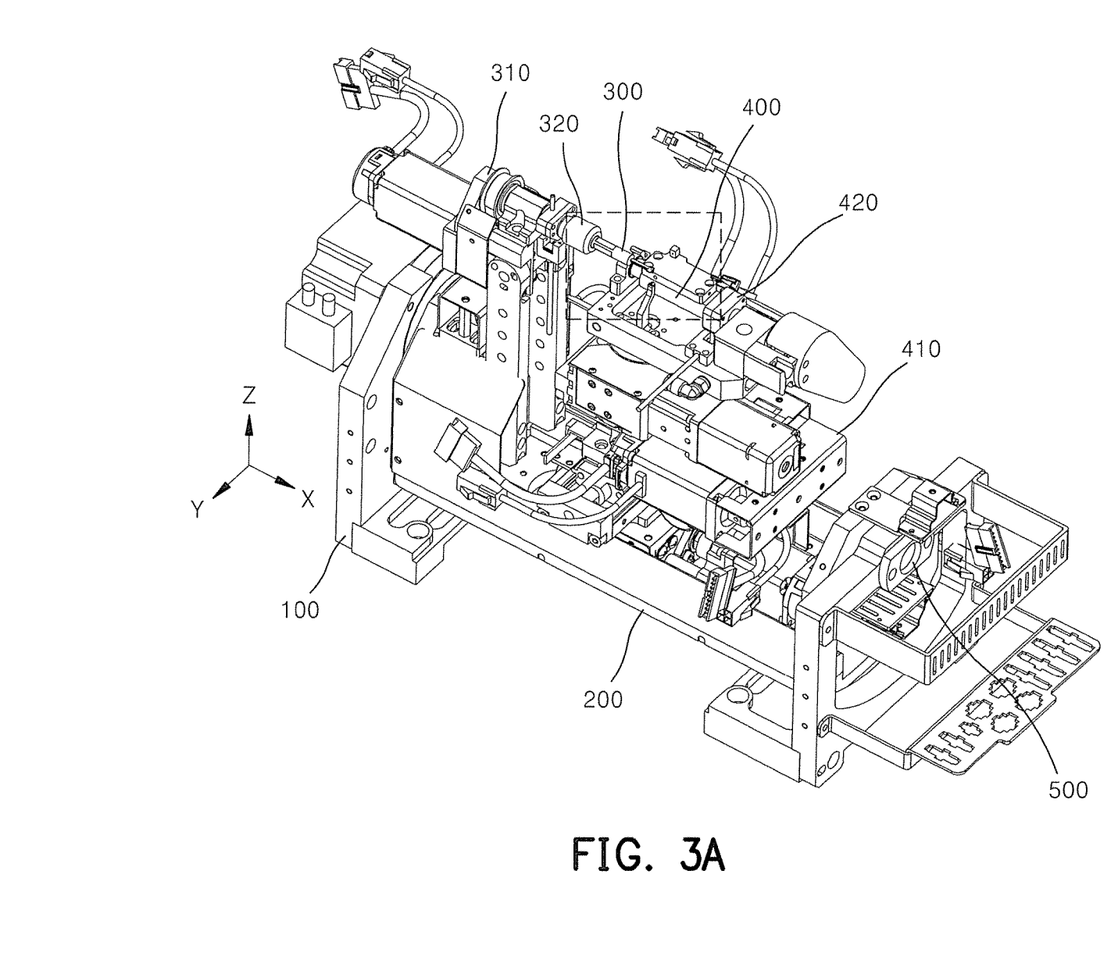
FIG. 3A is a perspective view of a portion of the apparatus used in the method of bonding a flexible part including inclined leads illustrated in FIG. 2.
Figure 3B:
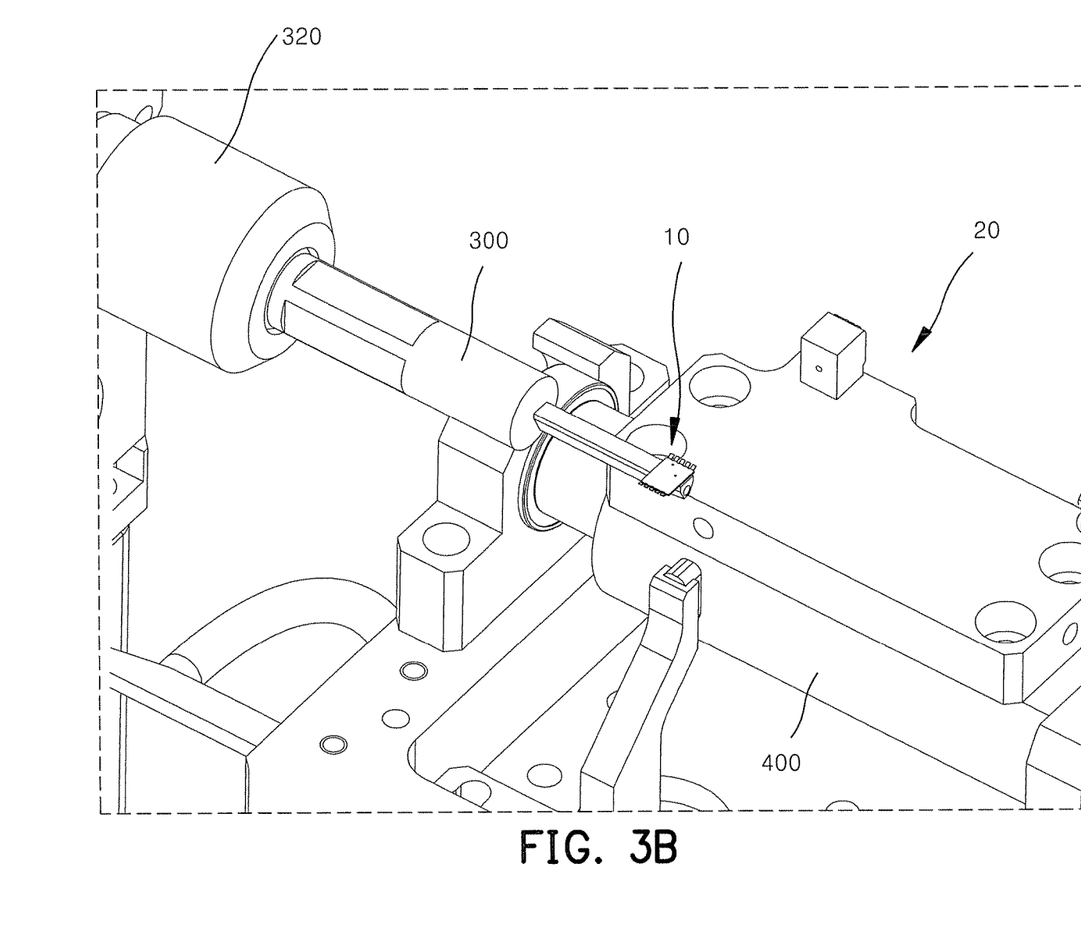
FIG. 3B is a partial enlarged perspective view of FIG. 3A.

FIG. 2 is a perspective view of an apparatus used in the method of bonding a flexible part including inclined leads according to an embodiment of the present disclosure. FIG. 3A is a perspective view of a portion of the apparatus used in the method of bonding a flexible part including inclined leads illustrated in FIG. 2. FIG. 3B is a partial enlarged perspective view of FIG. 3A.

Hereinafter, an X-direction, a Y-direction, and a Z-direction are defined and illustrated with respect to a support bracket 200. Axes of coordinates illustrated in FIGS. 2 through 8 are also defined with respect to the support bracket 200.

Referring to FIG. 2, the apparatus for bonding a flexible part used to perform the method of bonding a flexible part including inclined leads according to the present disclosure includes a base 100, the support bracket 200, a tilt unit 500, a first fixing member 300, a first transporting unit 310, a first rotating unit 320, a second fixing member 400, a second transporting unit 410, a second rotating unit 420, a bonding head 600, a pump head 700, an inspection camera 800, and a controller 900.

The base 100 supports the apparatus for bonding a flexible part including inclined leads used according to the present embodiment over all. The base 100 is formed of a rigid metal frame.

The support bracket 200 is mounted on the base 100. The support bracket 200 is rotatably mounted with respect to the base 100.

The tilt unit 500 is mounted over the base 100. The tilt unit 500 rotates the support bracket 200 with respect to the base 100 about a rotational axis in the X-direction, thereby adjusting an angle of the support bracket 200.

According to the apparatus for bonding a flexible part including inclined leads used in the present embodiment, the first fixing member 300 has a shape extending in the X-direction. An adsorption hole is formed in one end of the first fixing member 300. The first fixing member 300 clamps the main body 11 of the first part 10 through the adsorption hole by using a vacuum adsorption method.

The first fixing member 300 is liftably mounted with respect to the support bracket 200 in the Z-direction. The first transporting unit 310 lifts the first fixing member 300 with respect to the support bracket 200 in the Z-direction. When the first transporting unit 310 lowers the first fixing member 300 in the Z-direction, the first part 10 clamped by the first fixing member 300 moves near the second part 20.

The first rotating unit 320 is mounted between the first fixing member 300 and the first transporting unit 310. The first rotating unit 320 rotates the first fixing member 300 with respect to the first transporting unit 310 to thereby adjust an angle of the first part 10. According to the present embodiment, the first rotating unit 320 rotates the first fixing member 300 with respect to the rotational axis in the X-direction.

The second fixing member 400 clamps the second part 20. According to the present embodiment, the second fixing member 400 fixes the second part 20 by inserting the second part 20 into a recess having a shape corresponding to that of the second part 20 and adsorbing the second part 20.

The second fixing member 400 is movably mounted relative to the support bracket 200. That is, the second fixing member 400 is movably mounted to the support bracket 200 in the X-direction and the Y-direction with respect to the support bracket 200, and rotatably mounted with respect to each of a rotational axis in the X-direction and a rotational axis in the Y-direction.

The second transporting unit 410 is mounted between the support bracket 200 and the second fixing member 400. The second transporting unit 410 transports the second fixing member 400 with respect to the support bracket 200 in the X-direction and the Y-direction.

The second transporting unit 410 transports the second fixing member 400 with respect to the support bracket 200 in the X-direction and the Y-direction to thereby align a location of the second part 20 relative to the first part 10. As the location of the second part 20 is adjusted via operation of the second transporting unit 410, the second part 20 is located at a position corresponding to the first part 10.

The second rotating unit 420 is mounted between the second transporting unit 410 and the second fixing member 400. The second rotating unit 420 rotates the second fixing member 400 with respect to the support bracket 200 about a rotational axis in the X-direction and a rotational axis in the Y-direction. An angle of the second part 20 clamped by the second fixing member 400 is adjusted via a rotational operation of the second rotating unit 420. Accordingly, the bonding portion 21 of the second part 20 and the main body 11 of the first part 10 may be aligned to be in parallel with each other.

The bonding head 600 is disposed above the first fixing member 300 and the second fixing member 400. According to the present embodiment, the bonding head 600 having a structure as disclosed in US patent application publication 2016/0250704 (Sep. 1, 2016) is used. That is, the bonding head 600 that bonds parts by instantaneously melting spherical solder balls that pass by a capillary and ejecting the melted solder balls to a bonding point is used.

The pump head 700 is disposed above the first fixing member 300 and the second fixing member 400. According to the present embodiment, the pump head 700 is configured to coat the second part 20 with an epoxy as an adhesive.

The inspection camera 800 is disposed above the first fixing member 300 and the second fixing member 400. The inspection camera 800 captures an image of each of the first part 10 clamped by the first fixing member 300 and the second part 20 clamped by the second fixing member 400 and transmits the images to the controller 900. The controller 900 determines a location and angle of each of the first part 10 and the second part 20 by using the images received from the inspection camera 800.

The controller 900 controls operations of the first transporting unit 310, the first rotating unit 320, the second transporting unit 410, the second rotating unit 420, and the tilt unit 500 based on the images captured using the inspection camera 800, thereby adjusting and aligning relative locations and angles of the first part 10 and the second part 20.

Figure 1:
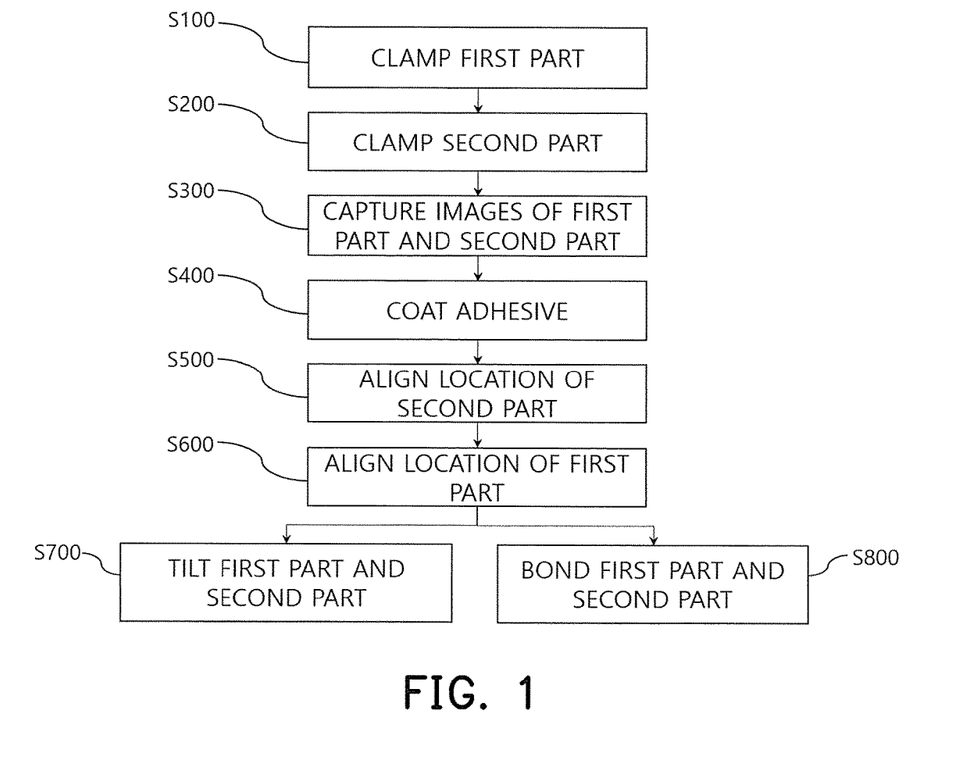
FIG. 1 is a flowchart of a method of bonding a flexible part including inclined leads, according to an embodiment of the present disclosure.

Hereinafter, an operation of performing the method of bonding a flexible part including inclined leads according to the present embodiment by using the apparatus for bonding a flexible part having the above-described configuration will be described with reference to FIG. 1.

The first part 10 is clamped using the first fixing member 300 by using the adsorption hole of the first fixing member 300 (step (a), S100). The first part 10 is supplied using a loading unit 1000 that is separately provided. The loaded first part 10 is adsorbed using the first fixing member 300 to be fixed.

Next, the second part 20 is clamped using the second fixing member 400 (step (b), S200). The second part 20 is also supplied using the loading unit 1000 and fixed to the second fixing member 400.

In this state, images of the first part 10 fixed to the first fixing member 300 and the second part 20 fixed to the second fixing member 400 are respectively captured by using the inspection camera 800 (step (g), S300). Information related to a fixed state, shape, and angle of each of the first part 10 and the second part 20 may be acquired from the images captured using the inspection camera 800.

Hereinafter, an operation of capturing images of the first part 10 and the second part 20 by using the inspection camera 800 will be described in further detail.

First, an operation of capturing an image of a fixed state of the first part 10 will be described. An image of the first part 10 is captured using the inspection camera 800 while the main body 11 of the first part 10 maintains level. A location and angle of the first part 10 may be determined based on a shape on the image of the first part 10. When the location and angle of the first part 10 are outside an allowable range, the fixed state of the first part 10 is determined as defective, and the method returns to step (a).

Next, an operation of capturing images of a shape and angle of the inclined leads 12 of the first part 10 will be described. The first fixing member 300 is rotated using the first rotating unit 320 such that the inclined leads 12 of the first part 10 are set in a direction in which they extend upwards. In this state, an image of the shape of the inclined leads 12 of the first part 10 is captured using the inspection camera 800. Height information of each of the inclined leads 12 of the first part 10 may be acquired from the captured images. For example, information about coplanarity of the plurality of inclined leads of the first part 10 may be acquired from the images that are captured while the first part 10 is rotated. If there is no difference in the heights of the inclined leads 12, the inclined leads 12 of the first part 10 have excellent coplanarity. If a difference in the heights of the inclined leads 12 is outside an error range, the inclined leads 12 of the first part 10 have a defective structure. In this case, the first part 10 is determined as defective, and the method returns to step (a).

Next, an operation of capturing an image of a shape and angle of the horizontal leads 13 of the first part 10 will be described. The first fixing member 300 is rotated using the first rotating unit 320 such that the horizontal leads 13 of the first part 10 are set in a direction in which they extend upwards. In this state, images of the shape of the horizontal leads 13 of the first part 10 are captured using the inspection camera 800. Like from the images of the inclined leads 12 described above, coplanarity information of the horizontal leads 13 of the first part 10 may be acquired from the images of the horizontal leads 13 captured using the inspection camera 800. When necessary, whether the first part 10 is defective or not may be determined based on the captured images of the horizontal leads 13.

When image capturing of the first part 10 is completed as described above, an image of the second part 20 is captured using the inspection camera 800. The second fixing member 400 is rotated using the tilt unit 500 and the second rotating unit 420 such that the bonding portion 21 of the second part 20 is horizontal to thereby adjust an angle of the second part 20. As a result, the bonding portion 21 of the second part 20 faces the inspection camera 800 located above the second fixing member 400. An image of the bonding portion 21 of the second part 20 is captured using the inspection camera 800. Information about a fixed state, shape, location, and angle of the second part 20 may be acquired from the captured image.

The images obtained using the inspection camera 800 is used in a subsequent aligning process. Accordingly, according to the method of bonding a flexible part including inclined leads of the present embodiment, relative locations between the first part 10 and the second part 20 may be accurately aligned.

Next, the bonding portion 21 of the second part 20 is coated with an epoxy by using the pump head 700 (step (h), S400). As the second rotating unit 420 has previously rotated the second fixing member 400 such that the bonding portion 21 of the second part 20 is horizontal, the bonding portion 21 of the second part 20 faces the pump head 700 located above the second fixing member 400. In this state, an epoxy is coated on the bonding portion 21 of the second part 20 by using the pump head 700. An adhesive force of the epoxy coated on the bonding portion 21 of the second part 20 has a function of supporting stable bonding between the first part 10 and the second part 20 later.

Next, an operation of aligning the first part 10 and the second part 20 will be described with reference to FIGS. 6A through 8.

The second transporting unit 410 is operated to transport the bonding portion 21 of the second part 20 to be placed under the main body 11 of the first part 10. Next, the second rotating unit 420 is operated to rotate the second fixing member 400 about a rotational axis in a X-direction and a rotational axis in a Y-direction to thereby adjust an angle of the second part 20 (step (c), S500). By adjusting the angle of the second part 20, the bonding portion 21 of the second part 20 and the main body 11 of the first part 10 are set to be in parallel with each other. Here, the images captured using the inspection camera 800 in step (g) are used. Locations and angles of the first part 10 and the second part 20 may be determined based on the images captured using the inspection camera 800. Differences in relative locations and angles between the bonding portion 21 of the second part 20 and the main body 11 of the first part 10 are calculated by using the images captured using the inspection camera 800, and then the second part 20 is aligned with respect to the first part 10.

Figure 6A:
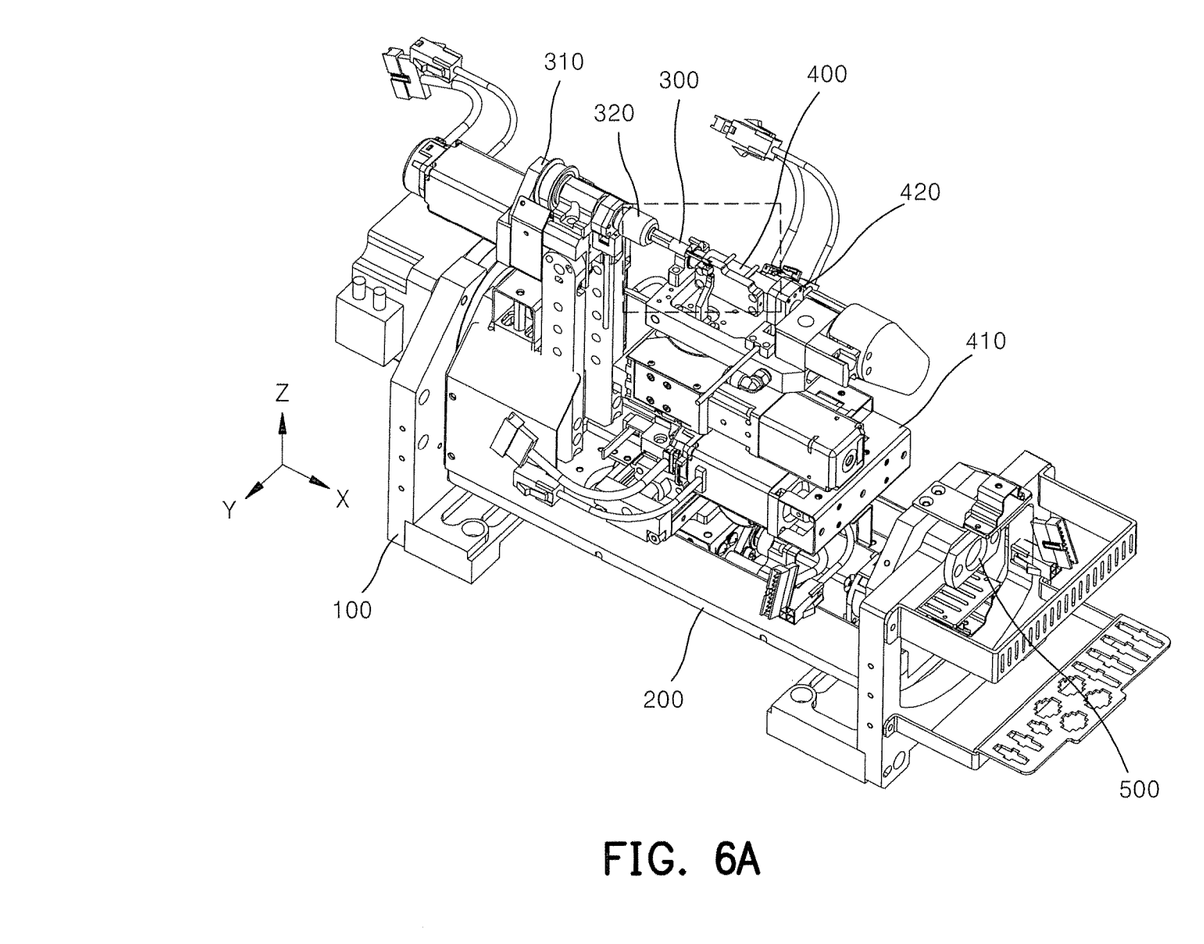
Figure 6B:
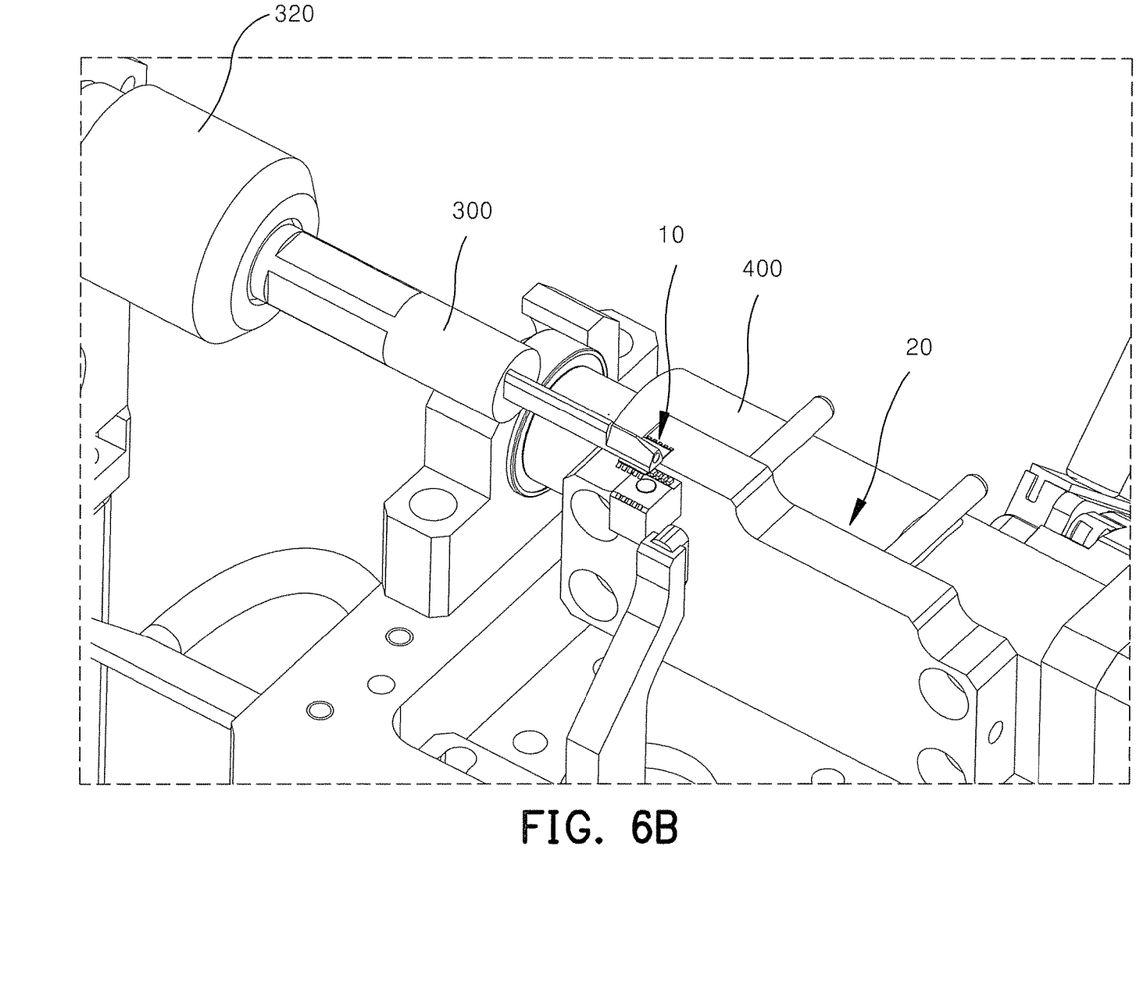

According to the above-described process, the bonding portion 21 of the second part 20 is aligned at an accurate location and in an accurate direction under the main body 11 of the first part 10 as illustrated in FIGS. 6A and 6B. According to the method of bonding a flexible part including inclined leads of the present embodiment, as the second transporting unit 410 and the second rotating unit 420 are controlled based on image capturing information obtained using the inspection camera 800, a location of the second part 20 may be accurately aligned. As the second part 20 is moved in and rotated about the X-axis and the Y-axis by using the second transporting unit 410 and the second rotating unit 420, respectively, a location and direction of the second part 20 with respect to the first part 10 may be accurately adjusted.

Next, a location and direction of the first part 10 clamped by the first fixing member 300 are aligned using the first transporting unit 310 and the first rotating unit 320 (step (d), S600). Step (d) is performed as follows in the present embodiment.

First, the first fixing member 300 is rotated using the first rotating unit 320 such that the main body 11 of the first part 10 and the bonding portion 21 of the second part 20 face each other (step (d-1)).

Figure 7A:
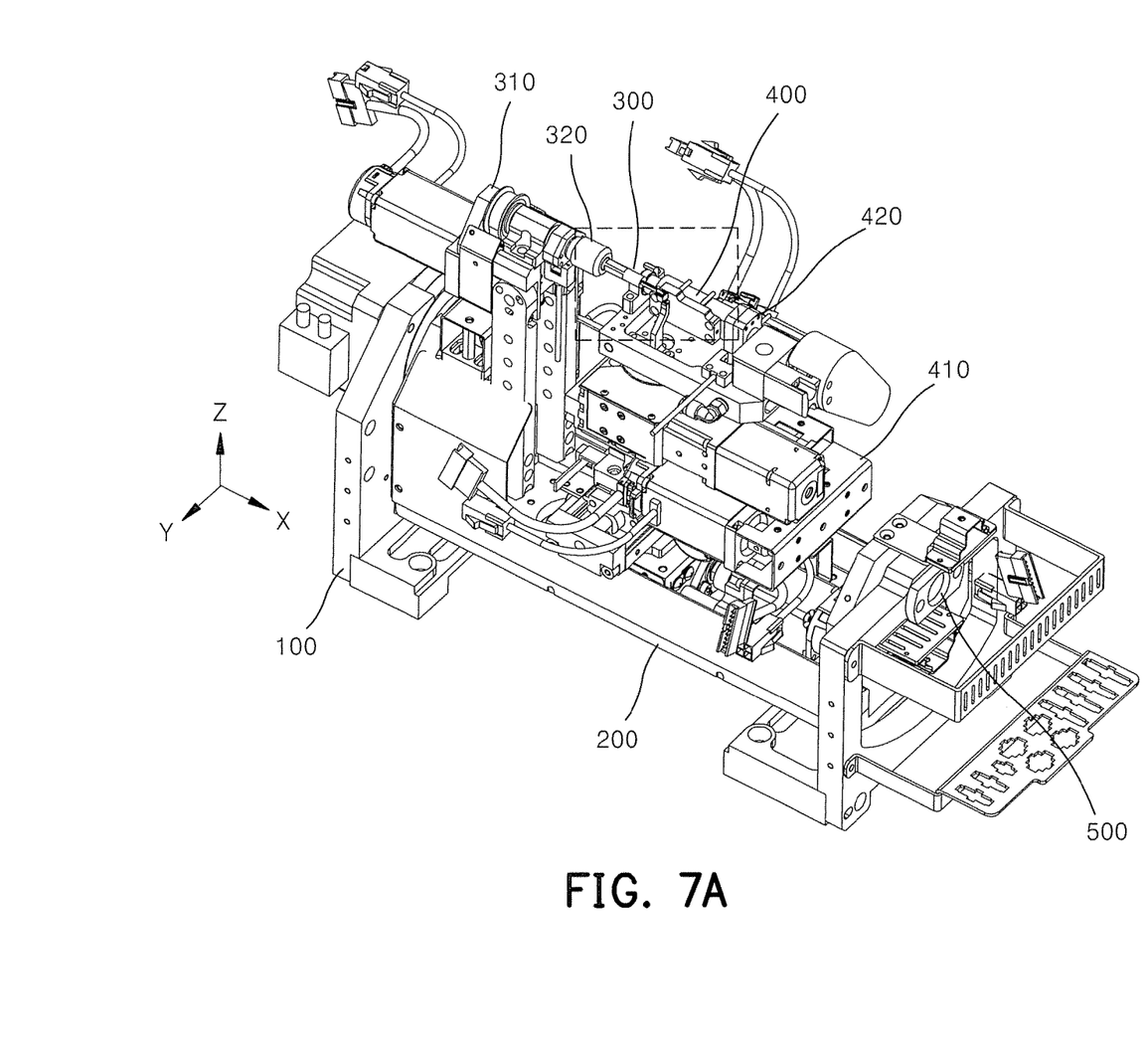
Figure 7B:
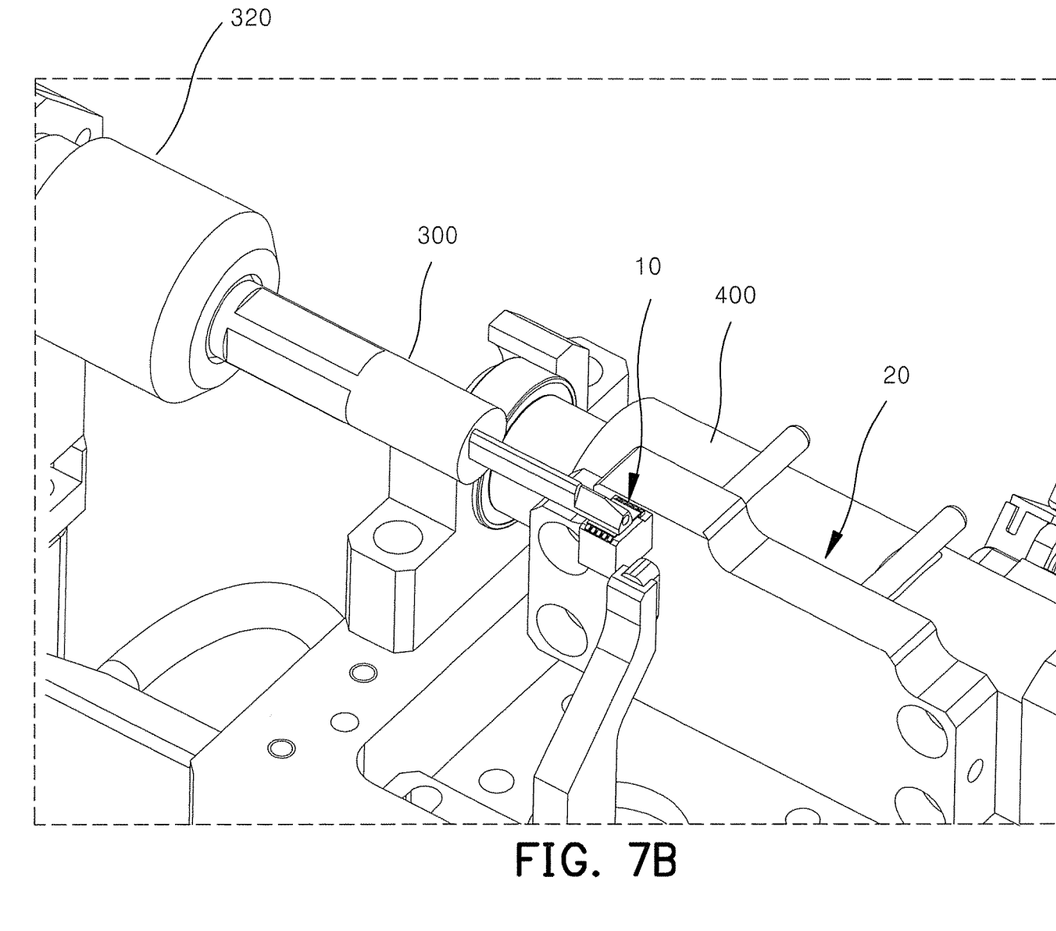

Next, the first fixing member 300 is lowered in a Z-direction by using the first transporting unit 310 (step (d-2)). When the first fixing member 300 is lowered, the main body 11 of the first part 10 moves near the bonding portion 21 of the second part 20. As the main body 11 of the first part 10 approaches the bonding portion 21 of the second part 20, the inclined leads 12 and the horizontal leads 13 of the first part 10 respectively approach the inclined pads 22 and the horizontal pads 23 of the second part 20. Here, coplanarity information of the inclined leads 12 and the horizontal leads 13 of the first part 10 and information about the shape and angle of the first part 10 and the second part 20 included in the images captured in step (g) are used. In particular, by using the coplanarity information, the inclined leads 12 of the first part 10 that are located farthest from the inclined pads 22 of the second part 20 may be determined. Based on this determination, the first fixing member 300 may be lowered until the inclined lead 12 of the first part 10, which is farthest from the inclined pads 22 of the second part 20, comes into contact with the inclined pads 22 of the second part 20. Through this operation, all of the plurality of leads 12 and the horizontal leads 13 of the first part 10 and the plurality of inclined pads 22 and the horizontal pads 23 of the second part 20 come into contact with each other. Meanwhile, due to the epoxy coated on the bonding portion 21 of the second part 20, the first part 10 and the second part 20 are bonded to each other. As the epoxy is hardened, an adhesive force between the first part 10 and the second part 20 is intensified. According to the above-described aligning method, the first part 10 and the second part 20 are set in a condition as illustrated in FIGS. 7A and 7B.

Next, an operation of performing bonding by rotating the support bracket 200 by operating the tilt unit 500 will be described.

Figure 8:
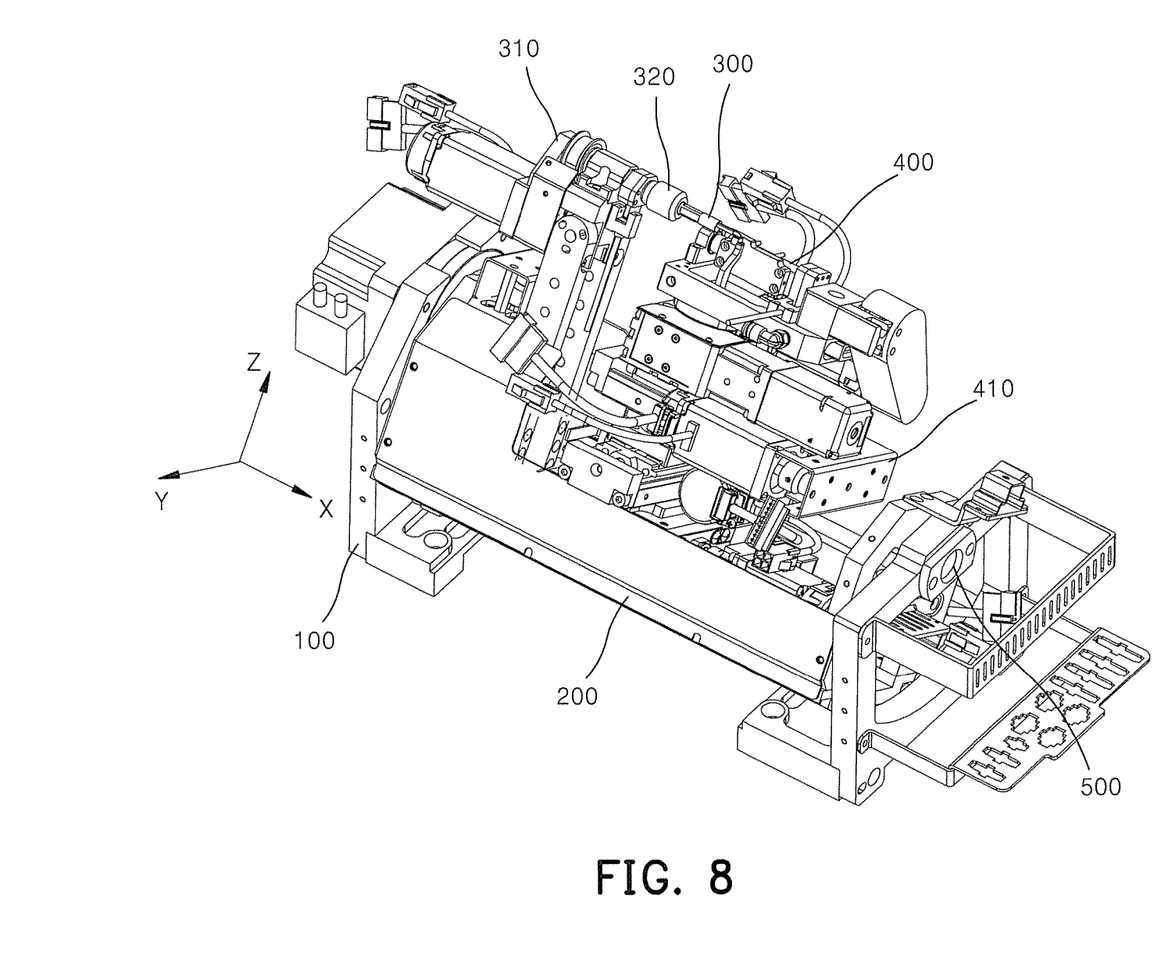

As illustrated in FIG. 8, the support bracket 200 is rotated using the tilt unit 500 such that the inclined leads 12 of the first part 10 and the inclined pads 22 of the second part 20 face the bonding head 600 (step (e), S700). As the support bracket 200 is rotated with respect to the base 100 by the tilt unit 500, the first fixing member 300 and the second fixing member 400 mounted on the support bracket 200 are rotated together. As the first fixing member 300 and the second fixing member 400 are rotated, the first part 10 and the second part 20 are also rotated. That is, the support bracket 200 is rotated by using the tilt unit 500 such that the plane where the inclined leads 12 of the first part 10 and the inclined pads 22 of the second part 20 face each other faces the bonding head 600.

In this state, melted solder balls are ejected to the inclined leads 12 of the first part 10 and the inclined pads 22 of the second part 20 by using the bonding head 600. The inclined leads 12 of the first part 10 and the inclined pads 22 of the second part 20 are bonded to each other by using the bonding head 600 ejecting the solder balls (step (f), S800).

When bonding between the plurality of inclined leads 12 of the first part 10 and the plurality of inclined pads 22 of the second part 20 is completed, the support bracket 200 is rotated by using the tilt unit 500 such that the plane where the horizontal leads 13 of the first part 10 and the horizontal pads 23 of the second part 20 face each other is horizontal (step (e), S700).

When the plane where the horizontal leads 13 of the first part 10 and the horizontal pads 23 of the second part 20 face each other faces the bonding head 600, melted solder balls are ejected using the bonding head 600. The plurality of horizontal leads 13 of the first part 10 and the plurality of horizontal pads 23 of the second part 20 are bonded to each other by using the bonding head 600 ejecting the solder balls (step (f), S800).

In an operation of bonding two parts by using a melted material such as solder balls, it is important to align a bonding surface of the parts to be on a horizontal plane. In particular, like in the present disclosure, when the first part 10 and the second part 20 are three-dimensional such that the inclined leads 12 and the horizontal leads 13 are respectively inclined, and the inclined pads 22 and the horizontal pads 23 are also inclined, the first part 10 and the second part 20 may be bonded to each other after accurately aligning them with respect to each other by using the above-described method. That is, after aligning the first part 10 and the second part 20 with respect to each other based on the support bracket 200, by tilting the elements mounted to the support bracket 200 as a whole, a space and direction for the bonding head 600 to perform a bonding operation may be effectively provided.

While the present disclosure has been described with reference to preferred embodiments above, the scope of the present disclosure is not limited to the embodiments described above and illustrated in the drawings.

For example, the first part 10 and the second part 20 described above are merely an example, and the present disclosure may be applied when other electronic parts are bonded to an inclined bonding surface of a three-dimensional part. In addition, as a major characteristic of the present disclosure is that the inclined leads 12 and the inclined pads 22 inclined with respect to a plane where the first part 10 and the second part 20 face each other may be bonded to each other, the present disclosure may also be applied to a first part and a second part that do not include the horizontal leads 13 and the horizontal pads 23 described above.

In addition, while it is described above that an epoxy is dispensed to the second part 20 by using the pump head 700, an epoxy may also be dispensed to the first part 10 by using the pump head 700.

In addition, while it is described above that images of parts are captured using the inspection camera 800 first, and then an epoxy is dispensed to perform a bonding operation, the process order is not limited to the above-described embodiment, and may be modified in any various manners. For example, a method of bonding a flexible part including inclined leads may be also be performed by using an apparatus for bonding a flexible part including inclined leads, which does not include the pump head 700. In this case, in the method of bonding a flexible part including inclined leads according to the present disclosure, only a bonding operation is performed without coating a second part with an adhesive. An operation of coating an adhesive between a first part and a second part may be performed in an additional operation, or such an operation may not be necessary.

In addition, while it is described above that the first part 10 is clamped using the first fixing member 300 by using a vacuum adsorption method, clamping methods of clamping the first part 10 by using the first fixing member 300 may be various. For example, when the first part 10 is a metal material, the first part 10 may be clamped by using the first fixing member 300 by using a magnetic force.

In addition, while the second fixing member 400 is described above as fixing the second part 20 by inserting the second part 20 into a recess having a shape corresponding to that of the second part 20 and adsorbing the second part 20, various methods, such as a vacuum adsorption method and an adsorption method by using a magnetic force, may be used as a method of clamping the second part 20 by using the second fixing member 400.

In addition, while it is described above that the second fixing member 400 is moved by using the second transporting unit 410 in the −X direction and the Y-direction, and the second fixing member 400 is rotated by using the second rotating unit 420 with respect to the support bracket 200 about a rotational direction in the X-direction, and a rotational direction in the Y-direction, directions in which the second transporting unit 410 and the second rotating unit 420 transport the second fixing member 400 to align parts with respect to each other and methods of the transporting may be various.

In addition, while the first fixing member 300 is described above to be lifted with respect to the support bracket 200 by using the first transporting unit 310 so as to make the first part 10 clamped by the first fixing member 300, to approach the second part 20, the first transporting unit 310 may be configured in various configurations in which the first part 10 approaches the second part 20.

In addition, while it is described above that the parts are aligned such that the main body 11 of the first part 10 and the bonding portion 21 of the second part 20 are parallel, according to circumstances, in order to further simplify a bonding operation, the main body of the first part and the bonding portion of the second part may not be set to be parallel. In detail, the first fixing member is rotated using the first rotating unit such that the first part is inclined with respect to the second part, and the first part is made to approach the second part by using the first transporting unit. Through this operation, the inclined leads of the first part approach the inclined pads of the second part while the inclined leads of the first part are inclined with respect to the inclined pads of the second part. According to this method, the inclined leads of the first part which are relatively far away from the inclined pads of the second part may be effectively adhered to the inclined pads of the second part. This method may be effective when coplanarity of the plurality of inclined leads of the first part is poor.

In addition, while it is described that angle of the first fixing member 300 and angle of the second fixing member 400 are modified by using the first rotating unit 320 and the second rotating unit 420, one of the two angle modifying operations may be omitted, or according to circumstances, both of the operations may be omitted.

In addition, while it is described above that the inspection camera 800 is included, images of parts may also be captured using more cameras. That is, a method of bonding a flexible part including inclined leads may also be configured by using cameras respectively added to the pump head and the bonding head so as to respectively perform an adhesive coating operation and a bonding operation by determining locations and directions of the first and second parts in real time.

In addition, while it is described above that an epoxy is dispensed to a side surface of the second part 20 by using the pump head 700, various adhesive materials other than an epoxy may be also used as the adhesive coated using the pump head 700.

According to the method of bonding a flexible part including inclined leads of the present disclosure, an electronic part may be easily bonded to a part having an inclined surface.

What is claimed is:

1. A method of bonding a flexible part including inclined leads, in which at least one inclined lead of a first part that is inclined with respect to a plane where the first part and a second part face each other, is bonded to at least one inclined pad of the second part formed to face the at least one inclined lead, the method comprising:
   (a) clamping the first part by using a first fixing member mounted to a support bracket that is rotatably mounted with respect to a base;
   (b) clamping the second part by using a second fixing member mounted to the support bracket;
   (c) transporting the second fixing member by using a second transporting unit that is fixed to the support bracket and transports the second fixing member relative to the support bracket so as to align a location of the second part with respect to the first part clamped by the first fixing member;
   (d) moving the first part, which is clamped by the first fixing member, near the second part clamped by the second fixing member, by using a first transporting unit that is mounted to the support bracket and transports the first fixing member relative to the support bracket;
   (e) rotating the support bracket with respect to the base by using a tilt unit rotating the support bracket with respect to the base, such that the at least one inclined lead of the first part and the at least one inclined pad of the second part face a bonding head bonding the at least one inclined lead to the at least one inclined pad; and
   (f) bonding the at least one inclined lead of the first part to the at least one inclined pad of the second part by using the bonding head.

2. The method of claim 1, wherein (d) is performed by using the first transporting unit and a first rotating unit rotating the first fixing member with respect to the first transporting unit together.

3. The method of claim 2, wherein (c) comprises adjusting an angle of the second part clamped by the second fixing member, by using a second rotating unit that is mounted to the second transporting unit and rotates the second fixing member.

4. The method of claim 3, wherein (d) comprises:
(d-1) rotating the first fixing member with respect to the first transporting unit by using the first rotating unit such that the first part and the second part face each other; and
(d-2) transporting the first fixing member relative to the support bracket by using the first transporting unit such that the first part approaches the second part.

5. The method of claim 3, wherein in (d), the first fixing member is rotated with respect to the first transporting unit by using the first rotating unit such that the first part is inclined with respect to the second part.

6. The method of claim 3, further comprising, after completing (a) and (b), (g) capturing an image of each of the first part fixed to the first fixing member and the second part fixed to the second fixing member, by using an inspection camera,
wherein (c), (d), and (e) are each performed by using the images captured using the inspection camera by performing (g).

7. The method of claim 6, wherein the at least one inclined lead of the first part includes a plurality of inclined leads, and the at least one inclined pad of the second part also includes a plurality of inclined pads,
wherein in (g), an image of the first part is captured using the inspection camera, while the first fixing member is rotated with respect to the first transporting unit by using the first rotating unit so as to capture an image of heights of the plurality of inclined leads of the first part,
wherein in (d), a distance of the first part from the second part is adjusted by operating the first transporting unit by considering a difference in the heights of the plurality of inclined leads of the first part based on the images captured using the inspection camera performed in (g).

8. The method of claim 3, further comprising (h) coating one of the first part and the second part with an adhesive by using a pump head such that the first part is adhered to the second part.

9. The method of claim 1, wherein in (a), the first fixing member clamps the first part by using one of a vacuum adsorption method and a magnetic force adsorption method, and
in (b), the second fixing member clamps the second part by using one of a vacuum adsorption method and a magnetic force adsorption method.

* * * * *